US006215363B1

(12) United States Patent
Conta et al.

(10) Patent No.: US 6,215,363 B1
(45) Date of Patent: Apr. 10, 2001

(54) LOW NOISE LOW POWER CHARGE PUMP SYSTEM FOR PHASE LOCK LOOP

(75) Inventors: Matteo Conta, Irvine; Akbar Ali, Garden Grove, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/405,752

(22) Filed: Sep. 27, 1999

(51) Int. Cl.[7] .............................. H03L 7/089; H03L 7/093

(52) U.S. Cl. ................... 331/17; 331/25; 327/157

(58) Field of Search ...................... 331/17, 25; 327/148, 327/157

(56) References Cited

U.S. PATENT DOCUMENTS 5,523,724 * 6/1996 Assar et al. .............................. 331/17
5,548,250 * 8/1996 Fang ....................................... 331/17

* cited by examiner

Primary Examiner—Siegfried H. Grimm
(74) Attorney, Agent, or Firm—Foley & Lardner

(57) ABSTRACT

In a phase lock loop, a charge pump includes a current mirror circuit. The current mirror circuit contains a bias current source and a current mirror source which mirrors the current of the bias current source. The current mirror source is turned on and off in accordance with an output signal from a phase detector to produce correction signals for a VCO. To conserve power, circuits are provided for turning the bias current source on just before it is needed by the current mirror source and for turning the bias current source off just after the current mirror source turns off.

28 Claims, 9 Drawing Sheets

LOW NOISE LOW POWER CHARGE PUMP SYSTEM FOR PHASE LOCK LOOP

FIELD OF THE INVENTION

This invention relates to phase lock loop circuits and, in preferred embodiments to phase lock loop circuits in power sensitive applications, and communications systems and devices employing the same.

BACKGROUND OF THE INVENTION

A phase lock loop (PLL) circuit is a circuit that is used for the synchronization of signals. Phase lock loops are used in a wide variety of electronic circuits where signals containing analog and digital information are decoded. They may be used in optical tachometers, motor control, television receivers, disk drives, modems, radios, and many other fields.

Phase lock loops can function as synchronizing circuits in which an output frequency is synchronized or locked to a reference frequency.

Some of the most commonly familiar uses of phase lock loops occur within a television receiver. When a signal is sent from a broadcast station to the television receiver the signal must be decoded to represent a picture and sound to be displayed on the television receiver. The television receiver must synchronize the portion of the picture being broadcast that represents the top of the picture to the top of the television screen, the television receiver must also synchronize the left side of the picture being broadcast to the left side of the television screen. The television receiver must also synchronize the colors received in the signal to the colors displayed on the television, so that the red remains red, the blue remains blue, and all the colors match those being broadcast. Somewhat less apparent is the fact that the television must synchronize itself to the sound carrier signal within the television signal so that the sound associated with the picture may be properly demodulated and reproduced through the speakers. All of these synchronizations typically occur through the use of phase lock loops in which the signals which are broadcast from the television transmitter are synchronized to the television circuits which actually process and display these signals.

PLLs are also used in mobile communication applications related to such purposes as frequency generation, signal modulation and demodulation, and data decoding and encoding.

PLLs are unsynchronized when they have no reference signal. In this condition the PLLs are said to be unlocked or out of lock. Phase lock loops generally work by comparing a reference frequency to a generated output frequency and adjusting the output frequency to match the reference frequency. As the output signal is adjusted by the loop there occurs a point at which the frequencies of the output and reference signals match. At this point the signals are sometimes said to be in frequency lock. When the generated frequency is further synchronized in phase with the input frequency the condition is often referred to as phase lock, the locked state, or simply lock. During lock, when the output frequency is synchronized with the reference frequency, the phase error between the output frequency and reference frequency may be very small or even zero. In the lock state the output signal will generally stay in lock until the phase lock loop is somehow perturbed. Some common factors that perturb phase lock loops are loss of the reference frequency, a change in the frequency or phase of the reference frequency, noise on the reference frequency, or noise in the system which disturbs the loop.

There are large number of variations of phase lock loops, and a large number of possible classifications, but they can be grouped into phase lock loops which contain only analog components, and phase lock loops that contain some or all digital components. The common analog or linear phase lock loops were the first to be developed. These phase lock loops ordinarily consist of three parts: 1) the phase detector, which compares the incoming reference frequency to the output frequency, 2) the loop filter, which is typically a low pass type filter built to form an active or passive RC filter, and 3) a voltage controlled oscillator. Digital elements have been gradually integrated into PLLs and hybrid versions have emerged which contain both analog and digital functions. All digital phase lock loop versions have also emerged in which all of the circuit functions are performed by digital circuits. With the advent of inexpensive fast microcontrollers, software versions of the phase lock loop, in which the loop functions are performed by a high speed microprocessor or microcontroller, have been developed. Digital versions of phase lock loops are achieving increasing popularity as their costs drop and their level of integration increases.

The phase lock loop has found extensive use in mobile communication circuits such as portable telephones. They are used to lock to transmitting and receiving frequencies and to recover clock signals from different digital data formats such as return to zero (RZ) and non return to zero (NRZ). As the communications devices, particularly portable telephones, have grown smaller and smaller the desire to obtain more operating time out of smaller and smaller packages has increased. Both small size and long battery life, which can be somewhat opposite constraints, are often seen as desirable characteristics.

There are two ways to address the desire to have smaller portable communications devices with increased operational time. The first is to produce more powerful batteries with a higher energy density and the second is to produce circuitry that consumes less power.

Several approaches have been used to minimize the rate of power consumption by these portable devices. One approach is to minimize the voltage on the circuitry within these portable devices by using circuit components that can operate at lower voltages. Another approach to minimize power consumption is to adopt techniques to enable operation of circuitry within the portable units only part of the time instead of continuously. For example the TDMA (Time Division Multiple Access) protocol allows several portable phones to share the same frequency by broadcasting only part of the time in successive time slots. By broadcasting during a time slot instead of continuously, the output power amplifier can be shut off for most of the time that the phone is active and power can be conserved.

SUMMARY OF THE DISCLOSURE

Accordingly, preferred embodiments of the present invention relate to communications systems and processes which minimizes power consumption while maintaining or enhancing performance.

Phase lock loops commonly comprise Voltage Controlled Oscillators which are adjusted until they match or "lock" to the phase of a reference signal. Commonly phase lock loops function by comparing a reference signal to the Voltage Controlled Oscillator signal and generating a correction signal based on the difference. The correction signal is used to adjust the Voltage Controlled Oscillator until it matches the reference signal. Correction signals may be of a variety of types well known in the art. Correction signals may be a voltage which controls the frequency of the Voltage Controlled Oscillator. Correction signals may also be a constant current pulse which varies in duration. Currently one method of generating current pulses is to employ a "current mirror". Current mirrors are pairs of current generators in which a first generator is controlled to produce a constant current, and a second generator mirrors the current of the first. To produce current pulses the second current generator is turned on and off with the on off duty cycle being proportional, in the case of a phase lock loop, to the correction signal. The first current generator commonly serves as a mirroring source and functions to set up a bias current for the second current pulse source.

In embodiments of the invention the first current source is switched on and off during the periods when the first current source is not being used as a mirror for the second current source, thereby conserving power. The first current source may be switched on and off via varying synchronizing mechanisms, and may be controlled to be on and stabilized when needed for mirroring by the second source.

DETAILED DESCRIPTION OF PREFERRED EMBODIMENTS

Figure 1:
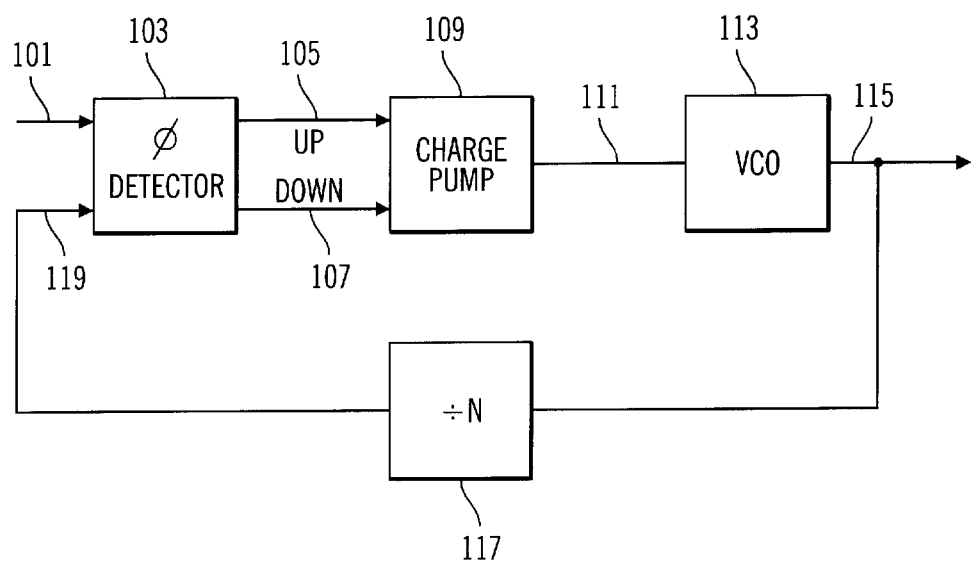
FIG. 1 is a block diagram of a digital phase lock loop.

A block diagram of a digital phase lock loop is shown in FIG. 1. The reference signal 101 is coupled into the phase detector 103, where it is compared with the feedback signal 119. The feedback signal may be the same as the output signal from the loop, or as illustrated in FIG. 1 the feedback signal may the output of the loop which has been divided in a divider circuit e.g. divider 117. The phase detector of a phase lock loop may be of several different types such as an exclusive OR gate, edge triggered JK flip flop, or a phase frequency detector (PFD). The phase frequency detector is illustrated in FIG. 1. The PFD phase detector has an advantage in that it's output depends on the frequency difference between the reference and feedback signals, not only on the phase difference of the reference and feedback signals as with some other phase detectors. This characteristic allows the PFD to achieve a much greater pull in range than can be achieved with some of the other phase detector methods.

The PFD 103 is coupled to a charge pump 109 via two signals. The UP signal 105 which will be coupled to the charge pump 109 and will tend to cause the charge pump to increase the frequency of the VCO (Voltage Controlled Oscillator) 113, and the DOWN signal 107 which will be coupled to the charge pump 109 and will tend to cause the charge pump to decrease the frequency of the VCO (Voltage Controlled Oscillator) 113. The output 111 of the charge pump 109 is coupled to the VCO 113. The VCO 113 is coupled to the charge pump to receive current pulses from the charge pump output 111 thereby controlling it's frequency. The output of the VCO 115, which is the output of the loop, is coupled to the divide by N circuit 117, which divides the output of the VCO 115 by N and couples the output of the divide by N 117 to the phase detector 103. Divide by N circuits are commonly used in phase lock loops, but may be eliminated in certain applications.

Figure 2:
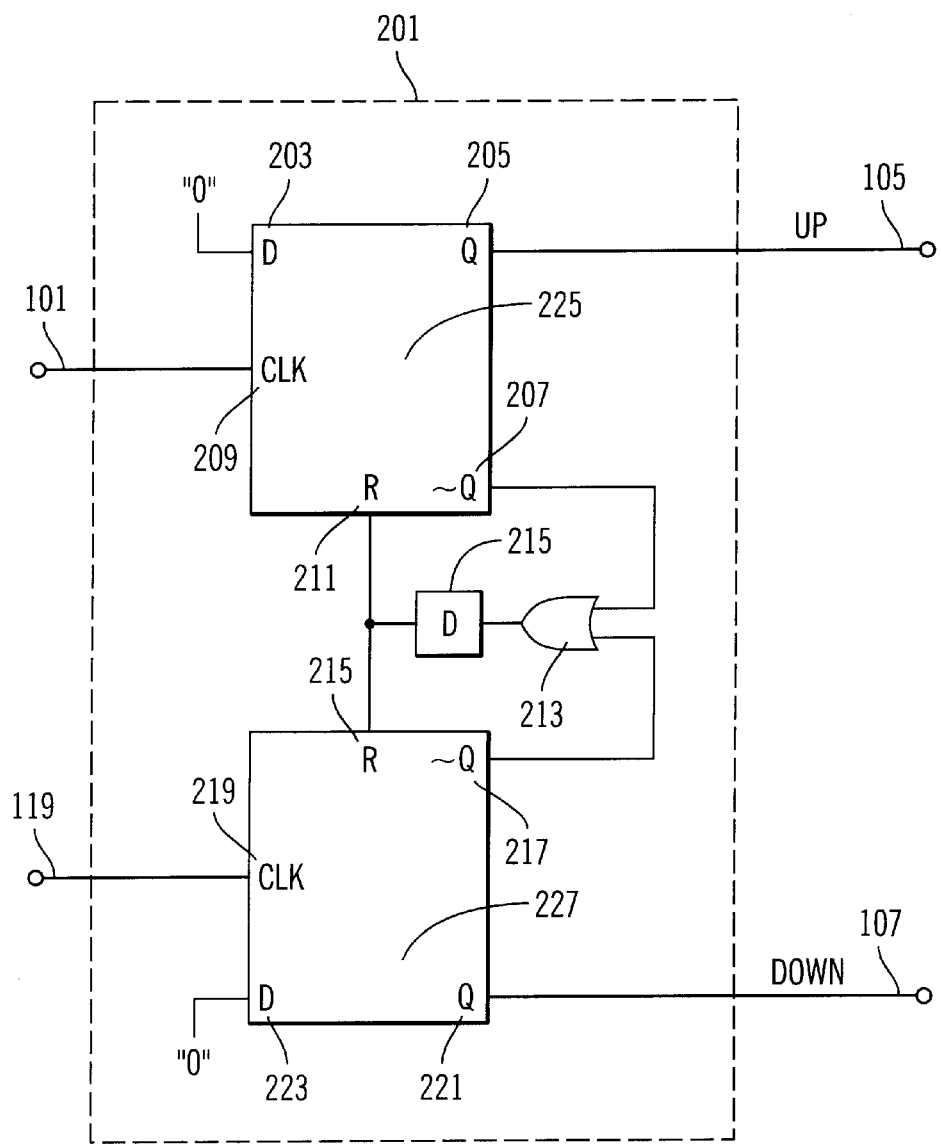
FIG. 2 is a circuit diagram of a PFD (phase frequency detector) circuit of the type which may be used with a digital phase lock loop.

FIG. 2 is an example of a PFD that may be used within a digital phase lock loop. The reference signal output is coupled into the PFD via 101 and the output from the loop is coupled into the PFD via the feedback signal on 119. The reference signal is the signal to which the loop will attempt to synchronize. The feedback signal is the generated signal which is to be synchronized with the reference signal when the loop is in lock. Within the PFD there are two D-type flip flops 225 and 227. The reference signal on 101 is coupled to the clock input 209 of flip flop 225 and, the feedback signal on 119 is coupled to the clock input 219 of flip flop 227. The ~Q output 207, of flip flop 225 is coupled to an input of an OR gate 213, and ~Q output 217, of flip flop 227 is also coupled to another input of the OR gate 213. The output of OR gate 213 is coupled through a delay 215, to the reset 211 of flip flop 225 and the reset 215 of flip flop 227. The Q output 205 of flip flop 225 comprises the UP signal 105 which is coupled to charge pump 109, and the Q output 221 of flip flop 227 comprises the DOWN signal 107 which is coupled to charge pump 109.

Flip flop 225 and flip flop 227 are rising edge triggered flip flops. If the leading edge of the reference signal on 101 arrives the same time as the leading edge 119 of the feedback signal then both flip flop 225 and flip flop 227 will be clocked at the same time. The "0" level will be clocked into the D input 203 of flip flop 225 and a level "0" will also be clocked into the D input 223 of flip flop 227. This will simultaneously cause the Q output 205 of flip flop 225 to be "0" and the Q output 221 of flip flop 227 to be "0", and the ~Q output 207 of flip flop 225 to be "1" and the ~Q output 217 of flip flop 227 to be "1". The "1" inputs from the ~Q outputs of both flip flop 225, and 227 will be coupled to OR gate 213 and cause it's output to change to "1". The "1" will be delayed in delay element 215 and after the delay will be coupled to the reset inputs to flip flops 225 and 227. The flip flops 225 and 227 will then be reset and the Q outputs of flip flops 225 and 227 will be reset to "1".

The result will be a pulse on the UP and DOWN outputs 105 and 107 which are identical. Because they are identical, the pulses will cause the charge pump to increase the frequency of the VCO by a given amount and to decrease the frequency by the same amount. In other words there will be no resultant change in frequency.

If however the rising edges of the signals 101 and 119 do not coincide this will cause the flip flop which is clocked first to have the data "0" clocked into it first. This will result in signals on the UP 105 and DOWN 107 outputs, which are coupled to the charge pump 109, which have different duty cycles with the result that the charge delivered to the VCO will differ from the case where the signals were synchronized. This difference in duty cycles will alter the frequency of the VCO and pull the circuits back into synchronization.

Figure 3:
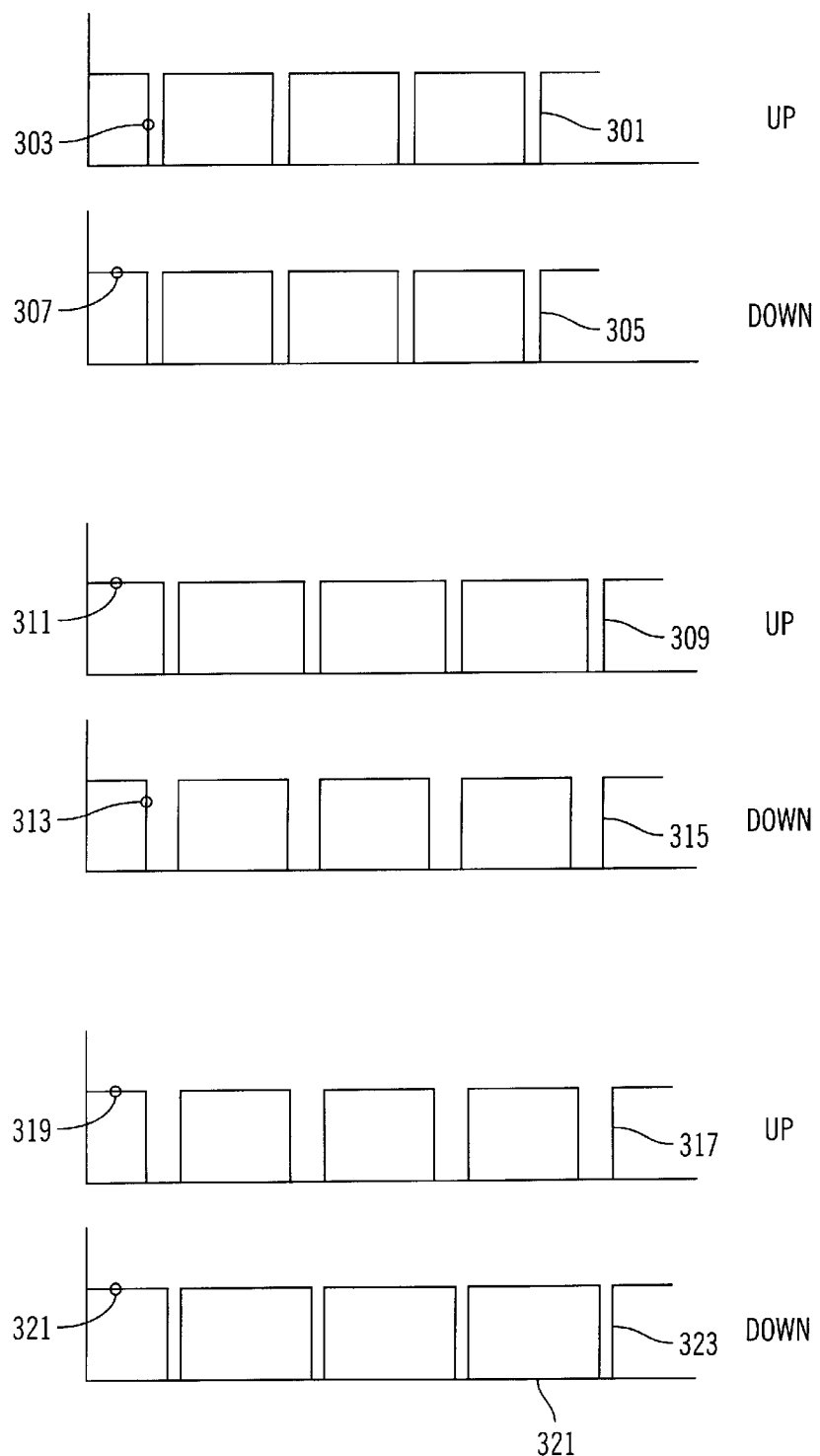
FIG. 3 is a graphic depiction of the UP and DOWN waveforms of a PFD (phase frequency detector) circuit showing the waveforms used to control the output of the charge pump.

FIG. 3 illustrates a process by which reference and feedback signals which are out of synchronization produce different UP and DOWN waveforms on outputs 105 and 107 of the phase detector 103 to control the charge pump in order to pull the signals back into lock. If the reference signal on 101 and the feedback signal 119 are synchronized, the UP and DOWN waveforms are as represented in wave forms 303 and 307. The UP pulses 301 and DOWN pulses 305 are identical, and the frequency will be maintained.

A situation where the frequency of the VCO is too high is illustrated in waveforms 311, and 313. The UP waveform 311, and the UP pulses 309 are unchanged from the case where the reference and feedback waveforms were synchronized. The DOWN waveform 313 has changed and the DOWN pulses 315 are wider. The wider pulses will force the VCO frequency to drop and therefore tend to reestablish synchronization of the reference and feedback signals.

A Situation where the frequency of the VCO is too low is illustrated in waveforms 319, and 321. The DOWN waveform 321, and the DOWN pulses 323 are unchanged from the case where the reference and feedback waveforms were synchronized. The UP waveform 319 has changed and the UP pulses 317 are wider. The wider pulses will force the VCO frequency to increase and therefore tend to reestablish synchronization of the reference and feedback signals.

Figure 4:
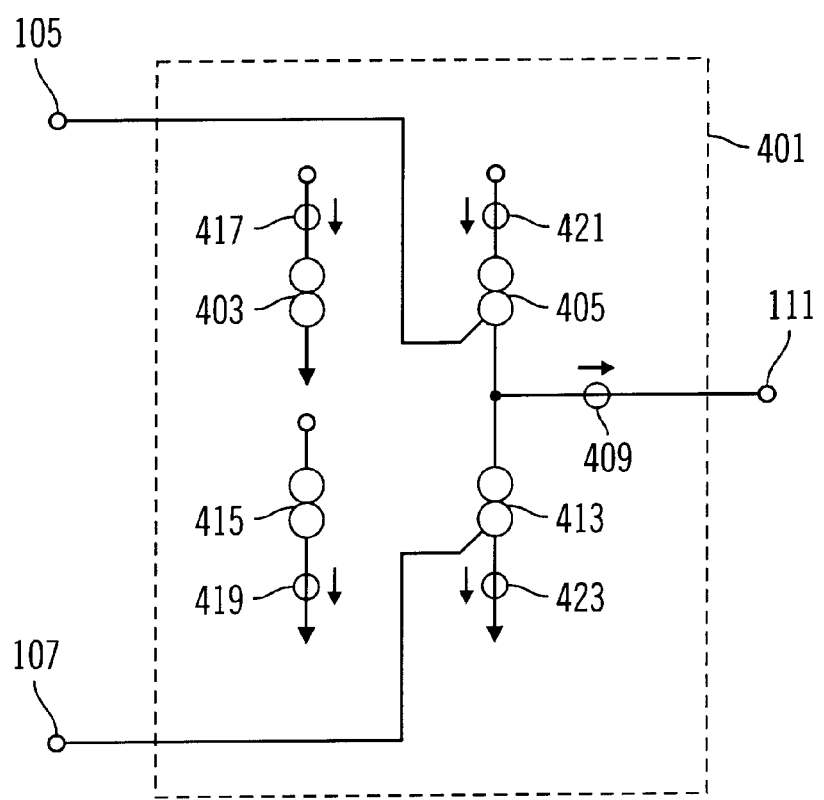
FIG. 4 is a circuit diagram of an example of a conventional charge pump.

FIG. 4 is an example of a conventional charge pump 401. Charge pumps are used to deliver constant amplitude currents to the VCO 113 of a phase lock loop. Within the charge pump are several current sources 403, 405, 413, and 415. Current mirror 405, the UP current mirror, is a current mirror of bias current source 403, and current mirror 413, the DOWN current mirror, is a mirror of bias current source 415. Accordingly, when UP current mirror 405 is turned on by the control signal at 105, for the time that it remains on, the amount of current that it will deliver 421 is equal to the current 417 that is flowing in bias current source 403. In other words it will mirror bias current source 403. Similarly when current mirror 413 is turned on using input 107 as the control line, for the time that it remains on, the amount of current that it will deliver 423 is equal to the current, 419 that is flowing in bias current source 415. In other words it will mirror current source 415.

The current 409 that is delivered to the VCO is the sum of the current 421 of the up current mirror 405, and the current 423 of the DOWN current mirror 413. If the UP and Down waveforms are equal, i.e. no change in frequency is needed, then the result will be that the current from current mirror 405 and current mirror 413 will cancel each other and no net current, 409, will be produced.

Higher amplitude current pulses generally mean that the loop response will be faster and loop gain will be higher. Having the amplitude of the current delivered to the VCO high also tends to increase noise immunity of the loop. The trade off for the increased performance gained by increasing the amplitude of the current pulses is that more power is consumed by the loop, because the bias current sources 403 and 415 must run at higher currents. This may be undesirable in many applications and may be particularly undesirable in portable applications where the battery power is finite and increasing power requirements in any circuit will shorten the operational time of the device between battery replacements.

Figure 5:
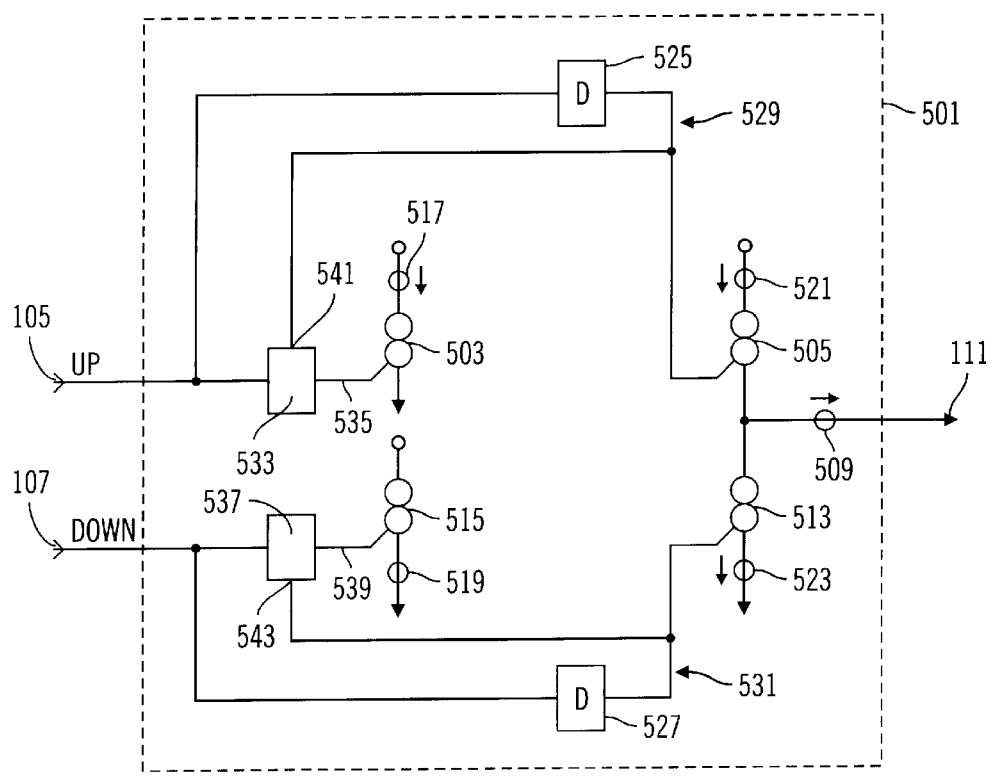
FIG. 5 is a circuit diagram of a charge pump circuit containing an example embodiment of the disclosure.

FIG. 5 is an example of a charge pump 501 containing circuitry that may be used with an embodiment of the present invention. FIG. 5 serves to illustrate how some of the problems of increased power consumption, when the current pulse amplitude is increased, can be overcome. In FIG. 5 control lines 535 and 539 have been added which were not present in the charge pump of FIG. 4. Control line 535 enables the UP bias current source 503 to be turned on and off. Control line 539 enables the DOWN bias current source 515 to be turned on and off. In this embodiment the UP bias current source 503 will be turned on only when needed to support current mirroring in UP current source 505, and the DOWN bias current source 515 will be turned on only when needed to support current mirroring in DOWN current source 513.

In addition devices 533 and 537 have been added. These devices enable the UP bias current source 503 to remain on while current pulses are being delivered by UP current mirror 505, and DOWN bias current source 515 to remain on while current pulses are being delivered by DOWN current mirror 513. These devices delay the turn off transition of the UP and DOWN pulses. Without device 533 the UP current mirror might be turned on at the same time UP bias source 503 was being turned off. Without device 537 the DOWN current mirror might be turned on at the same time DOWN bias source 515 was being turned off. Devices 533 and 537 can be various devices such as retriggerable monostable multivibrators whose time delayed turn off can be adjusted so that UP bias current source 503 is on at the time when UP current mirror 505 is delivering current and Down bias current source 515 is on at the time when Down current mirror 523 is delivering current. They also can be devices that are triggered on by an input, in this case 105 and 107 respectively, and triggered off, using inputs 541 and 543, by the falling edges of the turn off control of current sources 505 and 513 respectively. In this way the current in bias sources 503 and 515 can be maintained on until the current mirrors 505 and 523 are turning off and the current sources 503 and 515 no longer need be maintained as a mirror source for current sources 505 and 523 respectively. The sum of current 521 and current 523 form current 509, which is coupled into the VCO 113 though output 111.

Delay devices 525 and 527 have also been added to the charge pump in FIG. 5. These devices are delays that allow bias current sources 503 and 515 to be turned on and stabilize in advance of turning on current mirrors 505 and 523. In other words they delay the turn on of the current mirror in order to give the bias current source time to turn on and stabilize.

Figure 6:
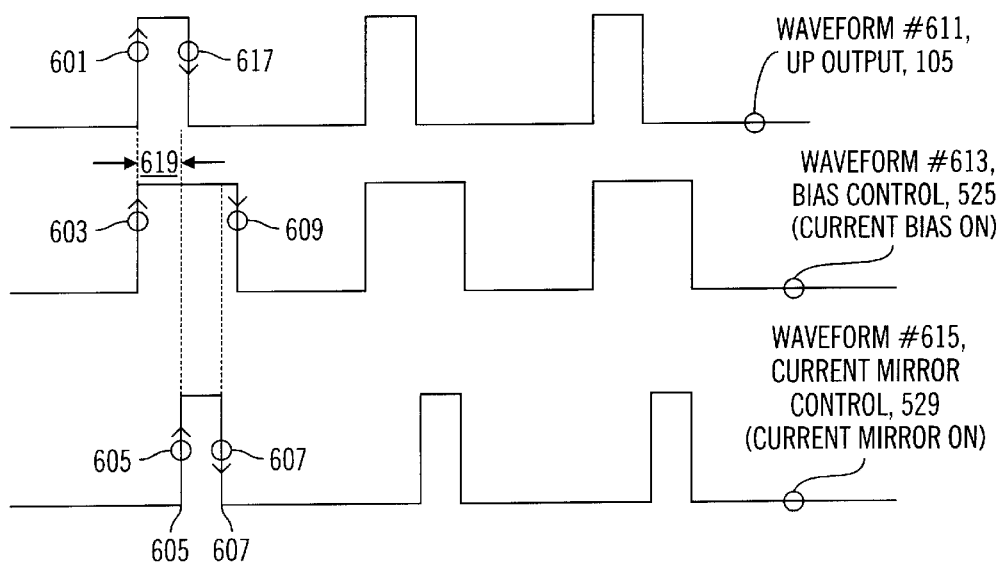
FIG. 6 is a representation of the waveforms of FIG. 5 showing the timing relationship of critical signals of the circuit in FIG. 5.

FIG. 6 is a set of waveforms that serve to illustrate the operation of charge pump of FIG. 5. Example illustrations would be similar for both the UP and the DOWN cases, so only one example, using the UP output 105, will be illustrated. The UP waveform 611 is the output 105 from phase detector 103, the leading edge of the UP waveform is shown as rising edge 601. The leading edge of the UP pulse immediately triggers an output rise in device 533 so that the turn on signal rising edge 603 appears at the output of device 533 a small propagation delay after the rising edge 601 occurs, as seen in waveform 613. The leading edge 601 is also coupled into delay element 525. The delay element is disposed between the UP signal and the current mirror 505 so that the bias current source 503 may turn on and stabilize before the current mirror 505, which will mirror bias current source 503, turns on. The leading edge 601 is delayed in delay device 525 and appears after a delay 619 as rising edge 605 of waveform 615. By the time a leading edge 605 is seen at 529 to turn on current mirror 505, the leading edge 603 of wave form 613 has already turned on bias current source 503 and it's output has stabilized. In other words the bias source is turned on and given time to stabilize and then the current mirror is turned on. At the end of the UP pulse a trailing edge 617 is encountered, this turn off is delayed in delay element 525 also therefore the trailing edge of the turn off 607 is also delayed with respect to waveform 611 as seen in waveform 615, the delay element delays both the leading and trailing edges. Because the bias source must be maintained on while the current mirror is turned off by the delayed trailing edge 617 of the UP pulse, the UP pulse is delayed in device 533 a period of time greater than the delay of device 525 so that the current source 503 will continue to be on until 609, a time calculated to be later than the trailing edge 607, the turn off time of the current mirror. In this way current source 503 will be on before current source 505 turns on, and will remain on for a period after current source 505 has turned off. This will assure that the current source 505 has a stable bias source to mirror from for the time that it is on.

By limiting the on period of bias current source 503 to only the time when it is needed as a bias for current mirror 505 power is saved over the current art where the bias currents such as 403 and 415 are continuously on even during periods where the current mirrors are off. This will allow a decrease in average current and yet can allow an increase in peak current, thereby improving the performance of the loop, without increasing and perhaps even decreasing the overall power consumption.

Figure 7:
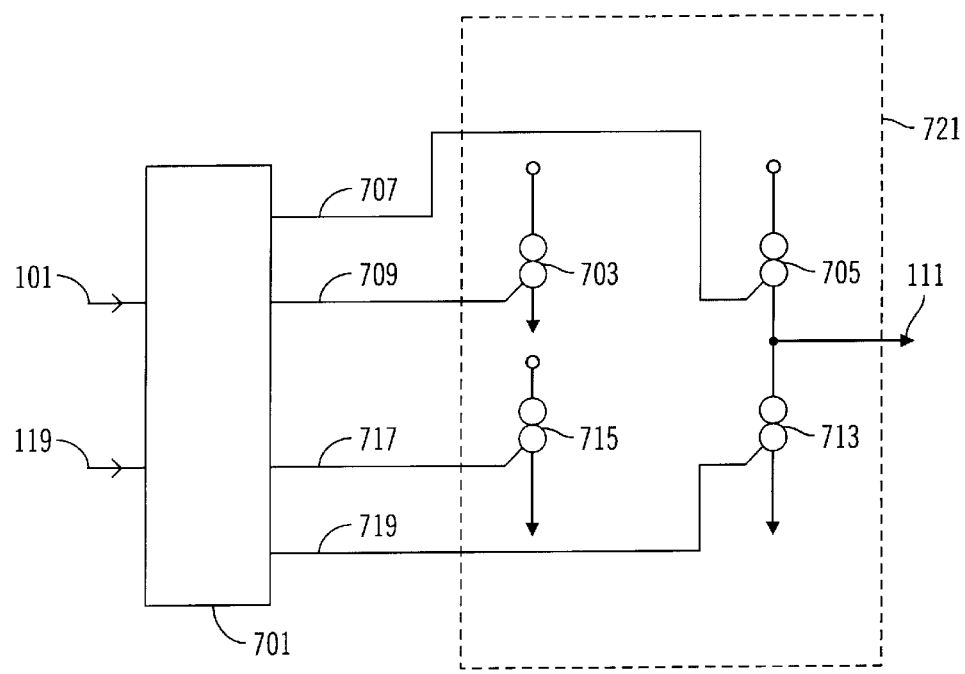
FIG. 7 is combination circuit and block diagram representation of a software phase lock loop according to an embodiment of the present invention.

FIG. 7 shows a block diagram of an alternate preferred embodiment of the present invention. The block 701 represents a software phase lock loop (SPLL). As fast microcontrollers and digital signal processors become less expensive SPLL's become viable alternatives to digital phase lock loops. SPLL's have the advantage that they can be tailored in software to an individual application. In the case of the present embodiment the SPLL can not only provide phase detection and synchronization, but can also provide the timing for signals to turn on current sources in this embodiment.

In FIG. 7 block 701 is a SPLL which controls a charge pump element 721. The SPLL 701 can control bias current source 703 using output 709 so that it turns on and stabilizes just prior to using output 707 to turn on current mirror 705. The current mirror 705 then turns on for a period as determined within block 701. Block 701 can then turn off current source 705, and a short time later turn off the bias current source 703. This insures that current mirror 705 has a stable source to mirror from, and that the bias current source 703 is not on any longer than needed to serve as a reference for current mirror 705.

Similarly block 701 can control inputs 717, and 719 so that bias current source 715 is only on during the period that is needed to serve as a mirror for current mirror 713, and off otherwise.

Another alternate approach that may be taken to implement embodiments of the invention described herein is to delay the feedback signal and the reference signal and use the undelayed reference signal and feedback signal to turn on the bias current sources in anticipation of turning on current mirror sources. An embodiment of this alternate implementation is illustrated in FIG. 8.

Figure 8:
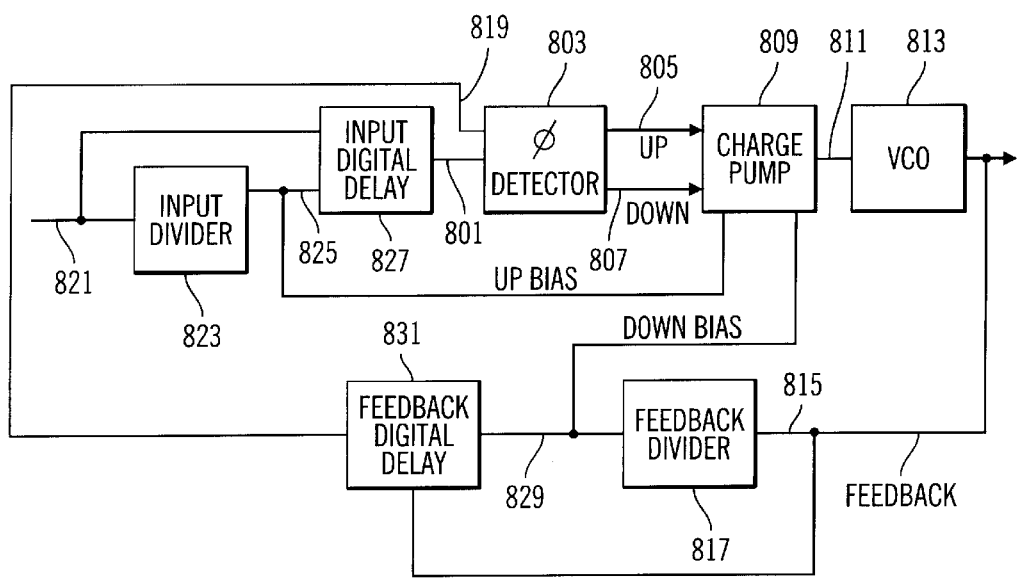
FIG. 8 is a block diagram representation of an embodiment employing a delay in the feedback signal and a delay in the reference signal.

In FIG. 8 a reference signal 821 is coupled into an input frequency divider 823. The output 825 of the divider 823 is then coupled to a digital delay circuit 827 and is also coupled to the charge pump as an UP bias current source turn on signal. The higher frequency reference signal 821 is then used as a clock in the input digital delay circuit 827 to delay the signal 825 out of the input divider 823. The delayed, divided reference signal 801, output from the digital delay 821 is then coupled into the phase detector 803.

In FIG. 8 the output 815 of the VCO 813 is coupled to the feedback divider circuit 817 where it is divided. The divided output signal 829 is then coupled to and digitally delayed in feedback digital delay unit 831 and to the charge pump as a DOWN bias current source turn on signal. The higher frequency output 815 of the VCO 813 is used as a clock in the feedback digital delay circuit 831. The output 819 of the digital feedback delay circuit 831 is coupled to the phase detector where it is compared with the divided and delayed reference frequency in a phase frequency detector circuit similar to that illustrated in FIG. 2. The phase detector 803 compares the delayed and divided reference signal to the delayed and divided feedback signal and forms the UP 805 and Down 807 signals which are coupled into the charge pump. Since both the reference signal and the feedback signals are delayed, the UP 805 signal is actually a delayed signal, so that the non delayed output 825 of the divider 823 can be used to activate the UP bias current source before the UP current mirror is turned on by the UP signal 805.

Figure 9:
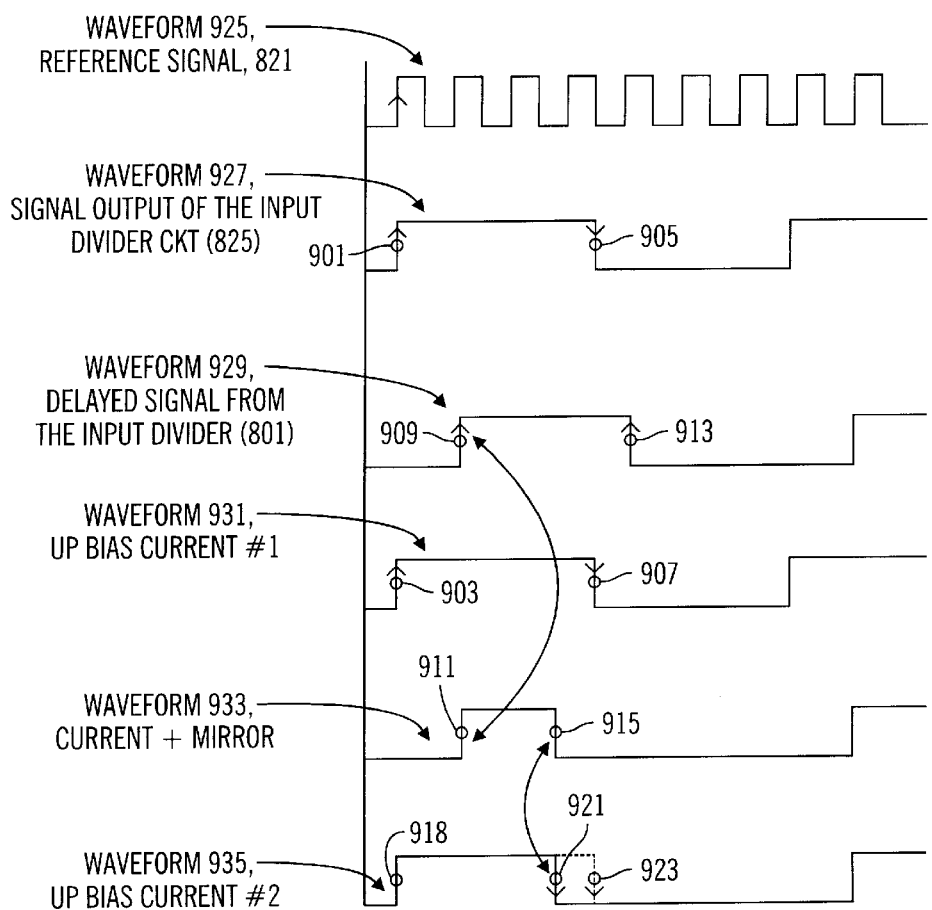
FIG. 9 is a depiction of waveforms illustrating an example operation of the embodiment in FIG. 8.

The embodiment of FIG. 8 is further illustrated in the series of graphical waveform diagrams in FIG. 9. Waveform 925, shows the reference signal for the phase lock loop. Waveform 927 is the output 825 of the input divider 823 which in this embodiment divides the reference signal by 4. Waveform 929 is identical to waveform 927 except it has been delayed by 1 reference signal cycle in the digital delay circuit 827. Waveform 931 is a signal for turning on the bias current. The leading edge 903 of the bias turn on waveform 903 is derived from the leading edge 901 of the signal out of the divider circuit 823. This leading edge, 931 will turn on the bias current. The current mirror turn on rising edge 911, as shown in waveform 933 is derived from the leading edge 909 of the delayed waveform 929. As can be seen, the bias current will turn on with a rising edge 903 one reference signal input cycle before the current mirror turn on at 911. The current mirror will turn off, 915, as seen in waveform 933 prior to the bias current turning off 907. The bias current waveform 931 trailing edge 907 must occur after the current mirror trailing edge 915, in order to assure that the bias current source is on while the current mirror is on thus assuring proper operation of the circuit. This can be accomplished in a variety of ways. One way is to make sure that the latest possible trailing edge of the bias current is such that it occurs later than the trailing edge, i.e. turnoff of the current mirror. This is shown as a trailing edge 923 in waveform 925. An alternate method of controlling the turn off is to use the turning off of the current mirror to trigger the turn off of the bias current. This is shown in waveform 935 as the trailing edge 921.

By turning on and turning off the current sources that are used, for biasing the current mirror when the bias sources are not being used power can be saved without adversely affecting the performance of the loop. As those skilled in the art will appreciate there are many embodiments which can employ the principles illustrated within this disclosure. The embodiments chosen here were chosen because it is believed that these embodiments or variations of them are the most likely to be implemented. It will be understood that embodiments of the invention can be combined in various and piecemeal ways, e.g. dividers may be inserted or deleted and delays can be introduced in a variety of ways. Additionally there are various implementations and additional embodiments that may be effectively employed in utilizing the inventive concepts herein, and the present embodiments serve to illustrate the inventive concepts and in no way limit their application.

What is claimed is:

1. An apparatus within a phase lock loop, the phase lock loop containing a charge pump for controlling the frequency of a Voltage Controlled Oscillator, the apparatus comprising:
   a bias current source;
   a bias current source control input coupled to the bias current source for turning on and off of the bias current source is;
   a current mirror source defining a current magnitude substantially identical to the current of the bias current source when the current mirror source is turned on;
   a signal source providing a turn on signal coupled to the bias current source control input to control the turn on and turn off of the bias current source circuit;
   a delay element, for accepting the turn on signal and producing a time delayed turn on signal;
   a current mirror control input coupled to the time delayed turn on signal to control the turn on and turn off of the current mirror; and
   a frequency control input to the Voltage Controlled Oscillator (VCO) for accepting the output of the current mirror and thereby controlling the frequency of the VCO.

2. An apparatus as in claim 1 wherein the output of the current mirror source is coupled to the variable frequency oscillator for decreasing the frequency of the variable frequency oscillator.

3. An apparatus as in claim 1 wherein the output of the current mirror source is coupled to the variable frequency oscillator for increasing the frequency of the variable frequency oscillator.

4. An apparatus as in claim 1 the apparatus further comprising a delayed turn off circuit disposed between the bias current source control input and the turn on signal for maintaining the turn on signal at the bias current source control input for a time period after the turn on signal has been removed.

5. An apparatus as in claim 1 the apparatus further comprising a delayed turn off circuit disposed between the bias current source control input and the turn on signal whereby the device maintains the turn on signal at the bias current source control input until the turn off of the output of the current mirror is detected.

6. An apparatus as in claim 1 wherein the signal source providing a turn on signal provides the output of the Voltage Controlled Oscillator as the turn on signal.

7. An apparatus as in claim 1 wherein the signal source providing a turn on signal is the divided output of the Voltage Controlled Oscillator.

8. An apparatus as in claim 1 wherein the delay element is a digital delay element.

9. An apparatus as in claim 8 wherein the digital delay element is clocked from the output of the Voltage Controlled Oscillator.

10. An apparatus as in claim 1 further comprising circuitry which provides a reference signal as the bias current source control signal.

11. An apparatus as in claim 1 further comprising providing circuitry which provides a frequency divided reference signal as the current bias source control signal.

12. An apparatus as in claim 1 wherein the apparatus further comprises:
    a delay element which is a digital delay element.

13. An apparatus as in claim 12 wherein the apparatus further comprises:
    a digital delay element which is clocked from the output of the Voltage Controlled Oscillator.

14. In a phase lock loop, a method for improving the performance of the phase lock loop, the method comprising:
    detecting a charge pump control pulse;
    using the charge pump control pulse to turn on a current bias source;
    delaying the charge pump control pulse to produce a delayed charge pump control pulse; and
    using the delayed control pulse to turn on a current mirror which mirrors the bias source.

15. The method of claim 14 wherein the charge pump control pulse is an UP pulse tending to increase the frequency of a Voltage Controlled Oscillator.

16. The method of claim 14 wherein the charge pump control pulse is a DOWN pulse tending to decrease the frequency of a Voltage Controlled Oscillator.

17. The method of claim 14 wherein the current bias source is maintained in an on condition for a fixed time.

18. The method of claim 14 wherein the current bias source is maintained in an on condition until a turn off of the current mirror source is detected.

19. The method of claim 14 further comprising:
    inserting a delay between a reference signal input and a phase detector whereby the phase detector is presented with a delayed version of the reference signal;
    using the undelayed version of the reference signal to turn on the current bias source; and
    using the delayed version of the reference signal to turn on the current mirror source.

20. The method of claim 19 wherein the current bias source is maintained in an on condition for a fixed amount of time.

21. The method of claim 19 wherein the current bias source is maintained in an on condition until a turn off of the current mirror is detected.

22. The method of claim 19 further comprising
    inserting a divider circuit between the reference signal input and delay circuit, whereby a divided reference signal is produced for input to the delay circuit and a divided and delayed reference signal for input into the phase detector,
    using the divided undelayed version of the referenced signal to turn on the current bias source; and
    using the divided delayed version of the reference signal to turn on the current mirror source.

23. The method of claim 19 wherein the clock signal for the delay circuit is clocked from the reference signal.

24. The method of claim 14 further comprising:
    inserting a delay circuit between the output of a Voltage Controlled Oscillator and a phase detector whereby, the phase detector is presented with a delayed version of the output of the Voltage Controlled Oscillator;
    using the undelayed version of the output of the Voltage Controlled Oscillator to turn on a current bias source; and
    using the delayed version of the output of the Voltage Controlled Oscillator to turn on the current mirror source.

25. The method of claim 24 wherein the current bias source is maintained in an on condition for a fixed amount of time.

26. The method of claim 24 wherein the current bias source is maintained in an on condition until a turn off of the current mirror is detected.

27. The method of claim 24 further comprising inserting a divider circuit between the output of the Voltage Controlled Oscillator and the delay circuit, whereby a divided output of the Voltage Controlled Oscillator is produced for input to the delay circuit and a divided and delayed output of the Voltage Controlled Oscillator for input into a phase detector, using the divided undelayed version of the output of the Voltage Controlled Oscillator to turn on the current bias source; and using the divided delayed version of the output of the Voltage Controlled Oscillator to turn on the current mirror source.

28. The method of claim 24 wherein the clock signal for the delay circuit is clocked from the output of the Voltage Controlled Oscillator.

* * * * *